(12) United States Patent
Carothers et al.

(10) Patent No.: US 7,811,844 B2
(45) Date of Patent: Oct. 12, 2010

(54) METHOD FOR FABRICATING ELECTRONIC AND PHOTONIC DEVICES ON A SEMICONDUCTOR SUBSTRATE

(75) Inventors: Daniel N. Carothers, Oro Valley, AZ (US); Craig M. Hill, Warrenton, VA (US); Andrew T. S. Pomerene, Leesburg, VA (US); Timothy J. Conway, Gainesville, VA (US); Rick L. Thompson, Amherst, NH (US); Vu A. Vu, Falls Church, VA (US); Robert Kamocsai, Manassas, VA (US); Joe Giunta, Warrenton, VA (US); Jonathan N. Ishii, Fredericksburg, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 12/201,943

(22) Filed: Aug. 29, 2008

(65) Prior Publication Data

US 2009/0111200 A1  Apr. 30, 2009

Related U.S. Application Data

(60) Provisional application No. 61/000,575, filed on Oct. 26, 2007.

(51) Int. Cl.
*H01L 21/00* (2006.01)

(52) U.S. Cl. .................. 438/31; 438/311; 257/347; 257/E27.112; 257/E21.545; 257/E21.561

(58) Field of Classification Search .................. 438/31, 438/311; 257/347, E27.112, E21.32, E21.545, 257/E21.561, E21.564, E21.002; 27/347, 27/E27.112, E21.545, E21.561
See application file for complete search history.

(56) References Cited

U.S. PATENT DOCUMENTS 4,420,258 A   12/1983   Burns et al.

(Continued)

FOREIGN PATENT DOCUMENTS

EP   0 818 693   1/1998

(Continued)

OTHER PUBLICATIONS

L. C. Kimerling et al., "Electronic-photonic integrated circuits on the CMOS platform"; Joint Report sponsored under Defense Advanced Research Projects Agency's EPIC Program and executed by the Microsystems Technology Office, ARPA Order No. T239/03, Program Code 4H20 (no date of publication); pp. 1-10.

(Continued)

*Primary Examiner*—Khiem D Nguyen
(74) *Attorney, Agent, or Firm*—Antony P. Ng; Dillon & Yudell LLP; Daniel J. Long

(57) ABSTRACT

A method for fabricating photonic and electronic devices on a substrate is disclosed. Multiple slabs are initially patterned and etched on a layer of a substrate. An electronic device is fabricated on a first one of the slabs and a photonic device is fabricated on a second one of the slabs, such that the electronic device and the photonic device are formed on the same layer of the substrate.

11 Claims, 4 Drawing Sheets

U.S. PATENT DOCUMENTS

| | | | |
|---|---|---|---|
| 4,547,072 A | 10/1985 | Yoshida et al. | |
| 4,748,617 A | 5/1988 | Drewlo | |
| 4,921,354 A | 5/1990 | SooHoo | |
| 5,165,001 A | 11/1992 | Takagi et al. | |
| 5,281,805 A | 1/1994 | Sauer | |
| 5,371,591 A | 12/1994 | Martin et al. | |
| 5,430,755 A | 7/1995 | Perlmutter | |
| 5,625,636 A | 4/1997 | Bryan et al. | |
| 5,674,778 A | 10/1997 | Lee et al. | |
| 5,703,989 A | 12/1997 | Khan et al. | |
| 5,736,461 A | 4/1998 | Berti et al. | |
| 5,828,476 A | 10/1998 | Bonebright et al. | |
| 5,834,800 A | 11/1998 | Jalali-Farahani et al. | |
| 6,117,771 A | 9/2000 | Murphy et al. | |
| 6,242,324 B1 | 6/2001 | Kub et al. | |
| 6,306,722 B1 | 10/2001 | Yang et al. | |
| 6,331,445 B1 | 12/2001 | Janz et al. | |
| 6,387,720 B1 | 5/2002 | Misheloff et al. | |
| 6,400,996 B1 | 6/2002 | Hoffberg et al. | |
| 6,477,285 B1 | 11/2002 | Shanley | |
| 6,605,809 B1 | 8/2003 | Engels et al. | |
| 6,677,655 B2 | 1/2004 | Fitzergald | |
| 6,680,495 B2 | 1/2004 | Fitzergald | |
| 6,725,119 B1* | 4/2004 | Wake | 700/121 |
| 6,738,546 B2 | 5/2004 | Deliwala | |
| 6,785,447 B2 | 8/2004 | Yoshimura et al. | |
| 6,795,622 B2 | 9/2004 | Forrest et al. | |
| 6,850,252 B1 | 2/2005 | Hoffberg | |
| 6,861,369 B2 | 3/2005 | Park | |
| 6,936,839 B2 | 8/2005 | Taylor | |
| 6,968,110 B2* | 11/2005 | Patel et al. | 385/131 |
| 7,006,881 B1 | 2/2006 | Hoffberg et al. | |
| 7,010,208 B1 | 3/2006 | Gunn et al. | |
| 7,043,106 B2 | 5/2006 | West et al. | |
| 7,072,556 B1 | 7/2006 | Gunn et al. | |
| 7,082,247 B1 | 7/2006 | Gunn et al. | |
| 7,103,252 B2 | 9/2006 | Ide | |
| 7,110,629 B2* | 9/2006 | Bjorkman et al. | 385/14 |
| 7,139,448 B2 | 11/2006 | Jain et al. | |
| 7,215,845 B1 | 5/2007 | Chan et al. | |
| 7,218,809 B2 | 5/2007 | Zhou et al. | |
| 7,218,826 B1 | 5/2007 | Gunn et al. | |
| 7,259,031 B1 | 8/2007 | Dickson et al. | |
| 7,272,279 B2 | 9/2007 | Ishikawa et al. | |
| 7,315,679 B2 | 1/2008 | Hochberg et al. | |
| 7,333,679 B2 | 2/2008 | Takahashi | |
| 7,348,230 B2 | 3/2008 | Matsuo et al. | |
| 7,356,221 B2 | 4/2008 | Chu et al. | |
| 2003/0020144 A1 | 1/2003 | Warble et al. | |
| 2003/0026546 A1 | 2/2003 | Deliwala | |
| 2003/0113085 A1* | 6/2003 | M'Saad | 385/129 |
| 2003/0183825 A1 | 10/2003 | Morse | |
| 2004/0146431 A1 | 7/2004 | Scherer et al. | |
| 2004/0190274 A1 | 9/2004 | Saito et al. | |
| 2005/0094938 A1 | 5/2005 | Ghiron et al. | |
| 2006/0105509 A1* | 5/2006 | Zia et al. | 438/154 |
| 2006/0158723 A1 | 7/2006 | Voigt et al. | |
| 2006/0238866 A1 | 10/2006 | Von Lerber | |
| 2006/0240667 A1 | 10/2006 | Matsuda et al. | |
| 2007/0116398 A1 | 5/2007 | Pan et al. | |
| 2007/0202254 A1 | 8/2007 | Ganguli et al. | |
| 2008/0159751 A1 | 7/2008 | Matsui et al. | |
| 2008/0240180 A1 | 10/2008 | Matsui et al. | |

FOREIGN PATENT DOCUMENTS

| | | |
|---|---|---|
| EP | 1 067 409 | 1/2001 |
| WO | 93014514 | 7/1993 |
| WO | 01027669 | 4/2001 |
| WO | 02016986 | 2/2002 |
| WO | 2004088724 | 10/2004 |
| WO | 2007149055 | 12/2007 |

OTHER PUBLICATIONS

Kimmet, J. S., "M.S. Thesis: Integrated Circuit Fabrication Details"; 1999; 18 pp.

Pruessner et al., "InP-Based Optical Waveguide MEMS Switches with Evanescent Coupling Mechanism", Journal of Microelectromechanical Systems, vol. 14, No. 5, Oct. 2005.

May et al., "Integrated Process for Silicon Nitride Waveguide Fabrication", IBM Technical Disclosure Bulletin, vol. 33, No. 2, Jul. 1990.

Matsushita et al., "Narrow CoSi2 Line Formation on SiO2 by Focused Ion Beam", IEEE Xplore 1999.

Liu et al., "Design of Monolithically Integrated GeSi Electro-absorption Modulators and Photodetectors on an SOI Plaform", Optics Express 623, vol. 15, No. 2, Jan. 22, 2007.

Yap et al., "Integrated Opteoelectronic Circuits with InP-based HBTs", Proceedings of SPIE, vol. 4290, 2001.

Roth, "Electroabsorption Modulators for CMOS Compatible Optical Interconnects in III-V and Group IV Materials", Aug. 2007, (part 1 of 3).

Roth, "Electroabsorption Modulators for CMOS Compatible Optical Interconnects in III-V and Group IV Materials", Aug. 2007, (part 2 of 3).

Roth, "Electroabsorption Modulators for CMOS Compatible Optical Interconnects in III-V and Group IV Materials", Aug. 2007, (part 3 of 3).

Kik et al, "Erbium Doped Optical Waveguide Amplifiers on Silicon", MRS Bulletin 23(4), 48, Apr. 1998.

Chao et al., "Analysis of Temperature Profiles of Thermo-optic Waveguides", Fiber and Integrated Optics, vol. 33, Apr. 1994.

Okyay et al., "Silicon Germanium CMOS Optoelectronic Switching Device: Bringing Light to Latch", IEEE Transactions on Electron Devices, vol. 54, No. 12, Dec. 2007.

Mcaulay et al., "All-optical Switching and Logic with an Integrated Optic Microring Resonator", Proc. of SPIE vol. 5814, Mar. 2005.

* cited by examiner

METHOD FOR FABRICATING ELECTRONIC AND PHOTONIC DEVICES ON A SEMICONDUCTOR SUBSTRATE

PRIORITY CLAIM

The present application claims priority under 35 U.S.C. §119(e)(1) to provisional application No. 61/000,575 filed on Oct. 26, 2007, the contents of which are incorporated herein by reference.

STATEMENT OF GOVERNMENT INTEREST

The present invention was made with United States Government support under Contract No. HR0011-05-C-0027 awarded by DARPA. The United States Government has certain rights in the present invention.

BACKGROUND OF THE INVENTION

1. Technical Field

The present invention relates to integrated circuits in general, and in particular to integrated circuits having electronic and photonic devices. Still more particularly, the present invention relates to a method for fabricating electronic and photonic devices on a semiconductor substrate using complementary-metal oxide semiconductor (CMOS) technology.

2. Description of Related Art

Photonics is the science of molding the flow of light. Photonic band gap (PBG) materials are a new class of dielectrics that carry the concept of molding the flow of light to its ultimate level by facilitating the coherent localization of light. Light localization within a PBG material allows the realization of high-quality micro devices and the integration of such devices through a network of microscopic waveguide channels within a single all-optical microchip. Since light is caged within the dielectric microstructure, it cannot scatter into unwanted modes of free propagation and is forced to flow along engineered defect channels between the desired circuit elements. PBG materials, infiltrated with suitable liquid crystals, may exhibit fully tunable photonic band structures that enable the steering of light flow by an external voltage.

The single biggest obstacle to the realization of the above-mentioned photonic capabilities is the lack of a proven process for synthesizing high-quality, very large-scale PBG materials with significant electromagnetic gaps at micron and sub-micron wavelengths. One very promising PBG material that can be utilized to produce photonic devices is silicon. Producing photonic devices from silicon-based photonic crystals would be a very significant commercial advantage. However, silicon-based photonic devices tend to require a relatively large area on a substrate, which becomes a hurdle for integrating photonic devices with standard electronic devices on a single silicon substrate.

Consequently, it would be desirable to provide an improved method for fabricating photonic devices on a semiconductor substrate to allow the integration of electronic and photonic devices on the same semiconductor substrate.

SUMMARY OF THE INVENTION

In accordance with a preferred embodiment of the present invention, multiple slabs are patterned and etched on a layer of a substrate. An electronic device is fabricated on a first one of the slabs and a photonic device is fabricated on a second one of the slabs, such that the electronic device and the photonic device are formed on the same layer of the substrate.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
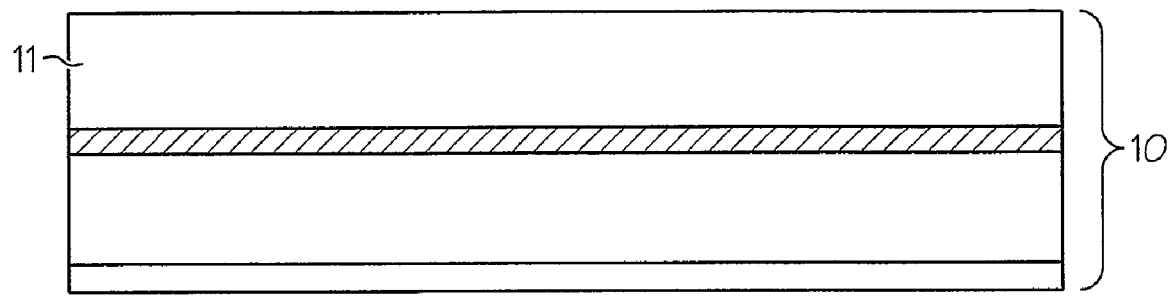
FIGS. 1-12 are diagrams illustrating successive steps of a method for fabricating electronic and photonic devices on a semiconductor substrate, in accordance in with a preferred embodiment of the present invention.
Figure 2:
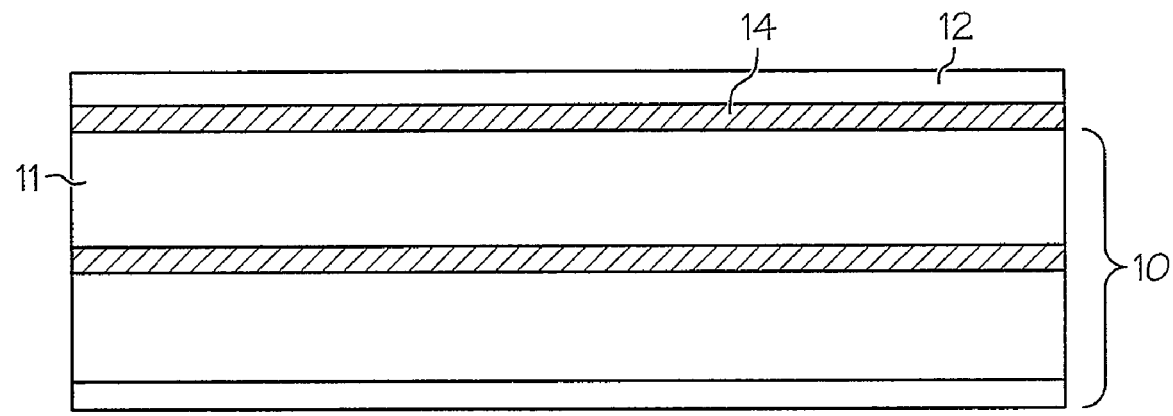

Referring now to the drawings and in particular to FIGS. 1-12, there are illustrated successive steps of a method for fabricating electronic and photonic devices on a semiconductor substrate, in accordance with a preferred embodiment of the present invention. The method of the present invention begins with a silicon-on-insulator (SOI) substrate 10, as shown in FIG. 1, although the method of the present invention is also applicable to bulk silicon substrates. Preferably, SOI substrate 10 has a 3 μm baseline lower clad layer and a 2,500 Å undoped epi layer 11. A pad oxide layer 14 and a pad nitride layer 12 are then deposited on SOI substrate 10, as depicted in FIG. 2. Preferably, pad oxide layer 14 is ~90 Å thick, and pad nitride layer 12 is ~1,190 Å thick.

Figure 3:
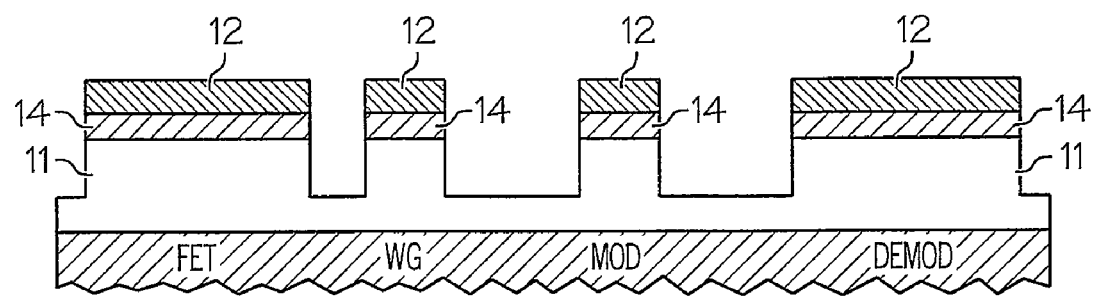

Areas intended for the formation of electronic and photonic devices are then patterned and etched using standard complementary-metal oxide semiconductor (CMOS) techniques. The etch leaves a prescribed amount of remaining silicon layer 11. For the present embodiment, slabs for a field-effect transistor (FET), a waveguide (WG), a ring modulator (MOD) and demodulator (DEMOD) are partially formed, as shown in FIG. 3. The field-effect transistor represents electronic devices in general. The waveguide, ring modulator and demodulator collectively represent photonic devices in general.

Figure 4:
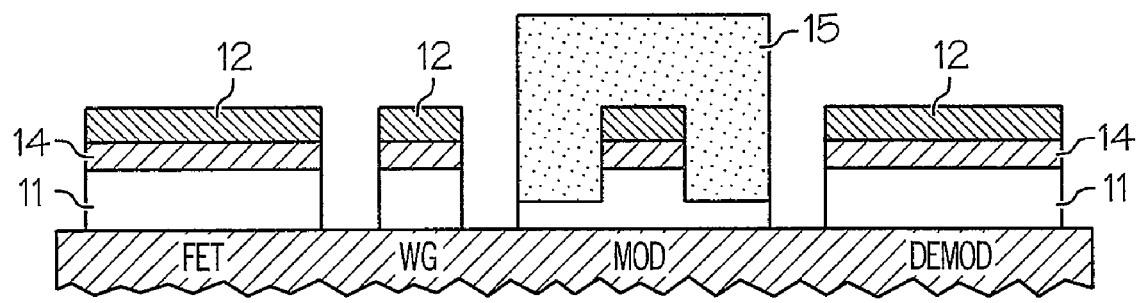

After a WGR mask 15 has been added to the modulator, as depicted in FIG. 4, epi layer 11 is further etched. The field-effect transistor is etched at the same time as the channel waveguide is being formed and slabs for the modulator (ridge waveguide) are being patterned. Although slabs are utilized in the present embodiment, slabs are not always required.

With a slight change in the mask design, the process order of these first two etches can be switched, so that the first etch completely patterns the active areas for the FETs, the channel waveguides, the demodulator block, and additionally patterns a large block for the ridge and slab of the ridge waveguide (modulator). The second mask and etch can then be used for a partial silicon etch that pattern the ridge waveguide and produces the desired slab. This alternate method is less preferred because of etch non-uniformities and alignment issues when coupling between channel and ridge waveguides.

Figure 5:
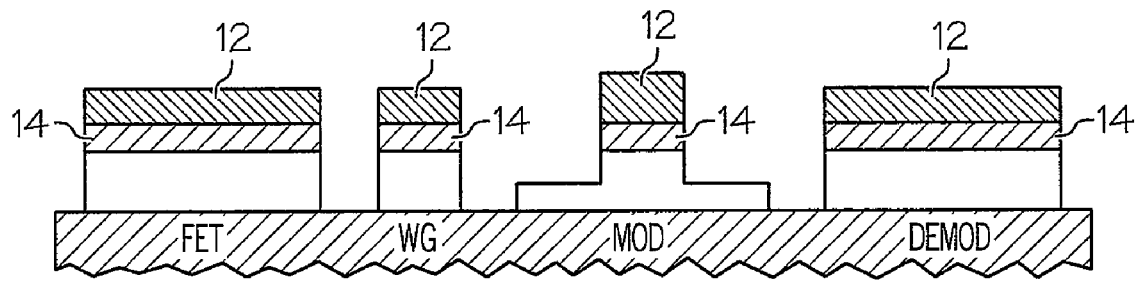

After either etch order, a sidewall smoothing process is then utilized to smooth the sidewalls of the waveguide in order to reduce transmission loss. Pad nitride layer 12 protects the already very smooth top waveguide surface from chemical attack, as shown in FIG. 5.

Figure 6:
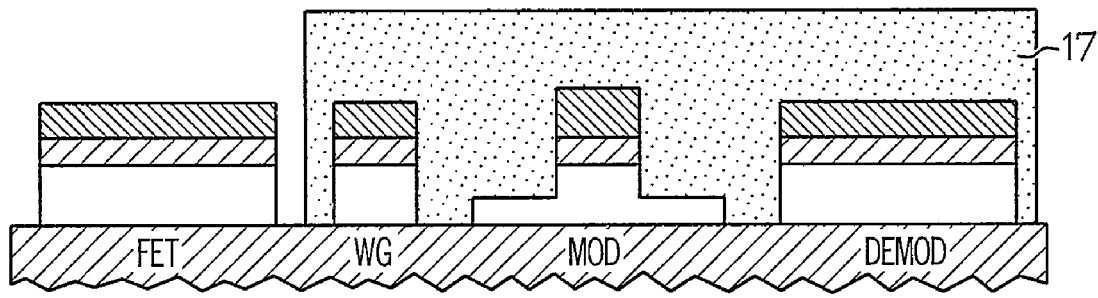

At this point, an HF dip (or liner pre-clean) is generally preformed on the field-effect transistor to decrease sub-threshold leakage by improving top corner rounding. However, for the photonic devices, a digital defined (DD) mask 17 is required, as depicted in FIG. 6, to prevent top corner rounding on the photonic devices that do not normally have a hardmask.

Figure 7:
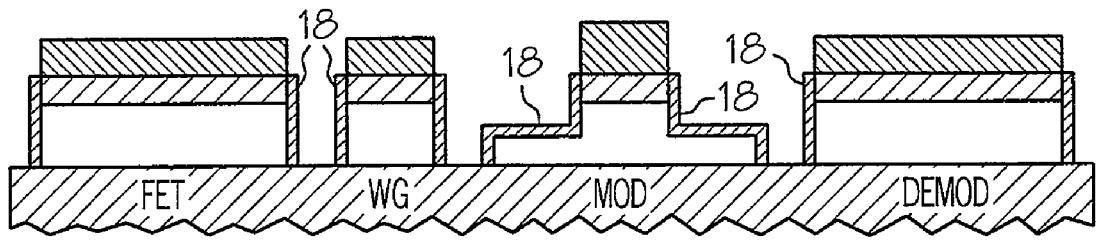

After removing DD mask 17, an oxide layer 18 of approximately 90-300 Å thick is grown on the exposed silicon surfaces, as shown in FIG. 7. This liner oxidation is a standard process for CMOS electronic devices. This linear oxidation may consume some of the silicon slab thickness, so the original slab thickness must include a consideration of such thickness loss. For CMOS electronic devices, the purpose of the liner oxidation is to reduce device leakage. The liner oxidation also has the added benefit of smoothing the waveguide sidewalls, which reduces optical transmission loss.

Figure 8:
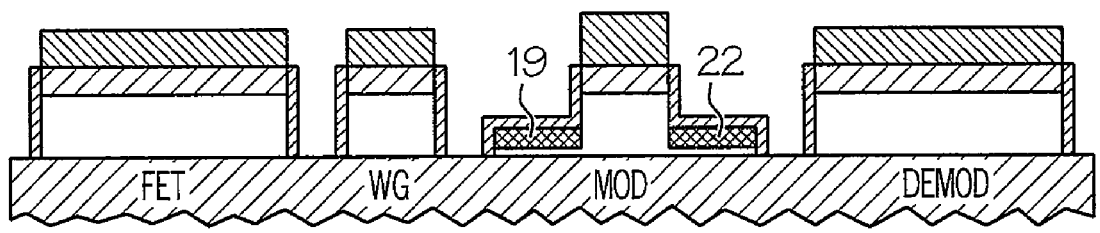

Next, a first resist layer is utilized to assist an N-type photonic implant on the modulator. Phosphorus at a concentration of $5 \times e^{18}/cm^2$ is preferably used for the N-type photonic implant. After the first resist layer has been removed, a second resist layer is utilized to assist a P-type photonic implant on the modulator and the second resist layer is removed. Boron at a concentration of $5 \times e^{18}/cm^2$ is preferably used for the P-type photonic implant. After the second resist layer has been removed, an N-type photonic implant 19 and a P-type photonic implant 20 are formed within the modulator, as depicted in FIG. 8.

Figure 9:
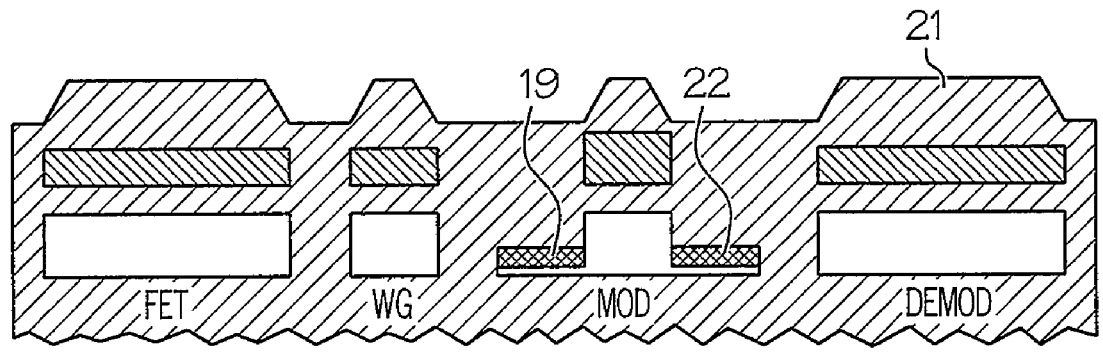

An oxide layer is subsequently deposited on substrate 10 via chemical vapor deposition (CVD) to a thickness of approximately 4,500 Å to form a cladding layer 21, as shown in FIG. 9. Cladding layer 21 serves as a cladding layer for the photonic devices and serves as the shallow trench isolation fill for the CMOS electronic devices.

Figure 10:
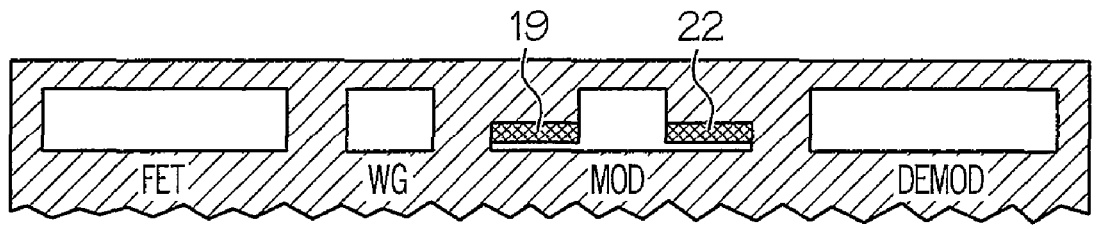

Cladding layer 21 is partially removed using a chemical mechanical polishing (CMP) process with pad nitride layer 12 (i.e., the nitride hardmask) as a polish stop. Pad nitride layer 12 is then removed using hot phosphoric acid with pad oxide layer 14 as an etch stop, as depicted in FIG. 10. The shallow trench isolation fill (i.e., cladding layer 21), CMP and nitride removal are standard CMOS processes that are simultaneously used to form a photonic cladding layer, and to remove the hardmask from the photonic channel waveguides, ridge waveguides, and demodulators.

Figure 11:
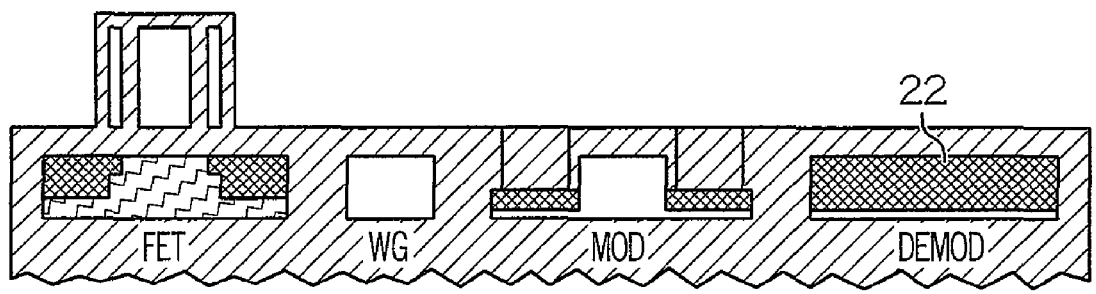

At this point, standard CMOS processing steps, which include body implants, gate oxide formation, gate patterning, LDD implants, halo implants, spacer formation, source/drain implants, and cap oxide deposition, and implant damage anneals, are utilized to form the field-effect transistor, as shown in FIG. 11. At any point during the standard CMOS processing steps, any required implants for the demodulator may also be completed, as indicated as an implant 22 in FIG. 11.

A resist pattern and subsequent oxide etch is then used to remove oxide from all regions where a metal silicide is desired. One mask and oxide etch are utilized for all desired oxide openings that are at the same height as the tops of the CMOS active areas (tops of the source/drain regions). A second mask and oxide etch are utilized for all desired oxide openings to a slab, if necessary. Standard silicide formation is then completed. Note that the waveguides are not silicided, since they remain to be protected by a top cap oxide layer. The top oxide layer is a cap oxide that is generally used in the CMOS processing steps. Additionally note that a silicided contact to a slab can also be made by creating raised pedestal that rises up from the slab and is at the same height as the tops of the CMOS active areas (tops of the source/drain regions). Using the pedestal can simplify processing, since the top of the pedestal can be opened and silicided using the same mask and etch used to open oxide windows for the CMOS devices. A raised pedestal is created by patterning the pedestal at the same time and in the same was as the ridges to the ridge waveguides.

Figure 12:
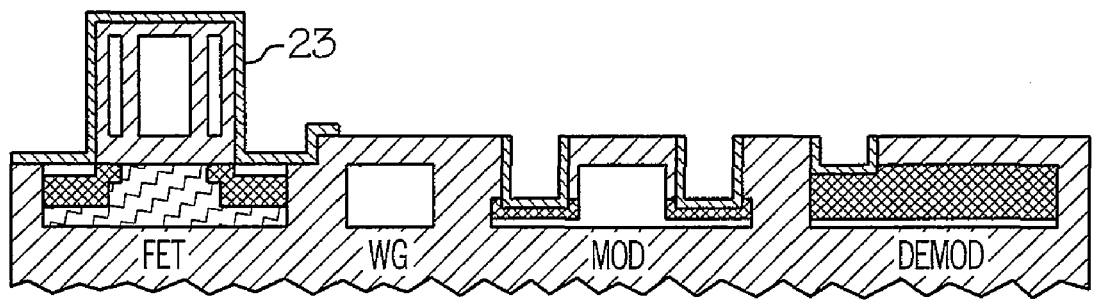

A barrier layer 23 is then deposited across the entire layer, preferably a silicon oxynitride layer of approximately 100-300 Å thick. A barrier layer is used to prevent the migration of ionic or metal contaminants into the field-effect transistor. The barrier layer is then removed from the photonic device regions using a resist mask, an etch, and a subsequent removal of the resist mask, as shown in FIG. 12. The barrier layer must be removed from the waveguide regions because the barrier film is likely to increase the optical transmission loss.

An oxide layer is then deposited, which serves as a passivation layer for the field-effect transistor and as a cladding layer for the waveguide. The passivation layer must be chosen for optimum performance of both the photonic and electronic devices. At this point, substrate 10 is ready for any special processing to form the demodulator, any desired processing to form contacts and metal layers, any additional waveguide layer, any other photonic devices, or any other CMOS devices.

As has been described, the present invention provides an improved method for fabricating electronic and photonics devices on a silicon substrate. The present invention allows a direct integration of both active and passive high-index contrast photonic structures with standard CMOS process technology in such a way as not only to allow all of the individual devices to work at an optimal level, but also to enable them to work together to form complex circuits that allow a circuit designer to take advantage of the best function of each type of devices to achieve the best possible performance.

The present invention enables a wide range of improved commercial devices, from combination inertial navigation units having both gyroscopic and global positioning system (GPS) functionality in three dimensions, to optical communications gear capable of 1 GHz or smaller optical channel spacing, allowing for fiber communications at a level never previously imagined.

While the invention has been particularly shown and described with reference to a preferred embodiment, it will be understood by those skilled in the art that various changes in form and detail may be made therein without departing from the spirit and scope of the invention.

What is claimed is:

1. A method for fabricating integrated circuits, said method comprising:

providing a substrate having an epi layer, an oxide layer, and a nitride layer sequentially formed thereon;

patterning and etching said epi layer, said oxide layer and said nitride layer to form a plurality of pre-slabs on said substrate;

selectively forming a waveguide resist (WGR) mask on one of said pre-slabs to assist a formation of a modulator;

etching said epi layer further to form a plurality of slabs, wherein said etching is performed by using said WGR mask on said one pre-slab and by using said nitride layer on said remaining pre-slabs as a hard mask;

removing said WGR mask from said substrate, wherein said nitride layer is located directly above said modulator having a thickness that is greater than the thickness of said nitride layer on remaining slabs;

growing an oxide layer on sidewalls of said slabs; and fabricating an electronic device on a first one of said slabs and a photonic device on a second one of said slabs, such that said electronic and photonic devices are formed on said substrate.

2. The method of claim 1, wherein said epi layer is a single crystal semiconductor layer.

3. The method of claim 1, wherein said epi layer is an amorphous semiconductor layer.

4. The method of claim 1, wherein said epi layer is a polycrystaline semiconductor layer.

5. The method of claim 1, wherein said electronic device is a field-effect transistor.

6. The method of claim 1, wherein said photonic device is a waveguide.

7. The method of claim 1, wherein said photonic device is a modulator.

8. The method of claim 1, wherein said photonic device is a demodulator.

9. The method of claim 1, wherein one of said slabs formed from said one pre-slab has a shape of an inverted "T".

10. The method of claim 1, wherein said method further includes depositing a second oxide layer on said slabs, after said sidewall oxide growing, to serve as a cladding layer for photonic devices and to serve as shallow trench isolation fill for electronic devices.

11. The method of claim 10, wherein said method further includes
removing said cladding layer on top of said slabs; and
removing said nitride layer on top of said slabs before said fabricating devices.

* * * * *